United States Patent [19]

Lee

[11] Patent Number: 5,657,278
[45] Date of Patent: Aug. 12, 1997

[54] RESTORE CIRCUIT FOR SEMICONDUCTOR MEMORY DEVICE AND STRUCTURE THEREOF

[75] Inventor: Dong Min Lee, Kyoungki-do, Rep. of Korea

[73] Assignee: Hyundai Electronics Industries Co., Ltd., Kyoungki-do, Rep. of Korea

[21] Appl. No.: 579,678

[22] Filed: Dec. 28, 1995

[30] Foreign Application Priority Data

Dec. 31, 1994 [KR] Rep. of Korea .................. 94-40584

[51] Int. Cl.$^6$ .................................................. G11C 7/00
[52] U.S. Cl. ...................... 365/189.09; 365/226; 365/205
[58] Field of Search ............................. 365/189.09, 205, 365/226, 227

[56] References Cited

U.S. PATENT DOCUMENTS 5,373,477 12/1994 Sugibayashi ....................... 365/226

Primary Examiner—David C. Nelms
Assistant Examiner—Huan Hoang

[57] ABSTRACT

A restore circuit for a semiconductor memory device with a sense amplifier and an internal supply voltage source, comprising a first PMOS transistor having its gate for inputting a first control signal from a first input line, its source and bias electrode connected in common to an external supply voltage source and its drain connected to an output line, the output line being connected to the sense amplifier, a second PMOS transistor having its gate for inputting a second control signal from a second input line, its source connected to the internal supply voltage source and its drain connected to the output line, and a feedback loop for feeding a voltage on the output line back to a bias electrode of the second PMOS transistor. According to the present invention, the restore circuit for the semiconductor memory device can generate a restore voltage which is stable with respect to a variation in an external supply voltage, with no increase in the number of manufacturing processes and no degradation in the drive capability.

3 Claims, 3 Drawing Sheets

RESTORE CIRCUIT FOR SEMICONDUCTOR MEMORY DEVICE AND STRUCTURE THEREOF

BACKGROUND OF THE INVENTION

1. Field of the Invention

The present invention relates in general to restore circuits for semiconductor memory devices for supplying a restore voltage to a sense amplifier using an internal supply voltage and an external supply voltage, and more particularly to a restore circuit for a semiconductor memory device which is capable of generating a restore voltage which is stable with respect to a variation in the external supply voltage, with no increase in the number of manufacturing processes and no degradation in the drive capability.

2. Description of the Prior Art

Generally, a semiconductor memory device such as a dynamic random access memory comprises a restore circuit for generating a high restore voltage in response to an external supply voltage Vext from an external power supply circuit and an internal supply voltage Vint from an internal voltage down converter. The restore circuit supplies the generated restore voltage to a sense amplifier, thereby allowing the sense amplifier to sense and amplify a data signal transferred thereto through a bit line. To this end, such a conventional restore circuit may comprise two PMOS transistors having their bias electrodes connected in common to an external supply voltage source. Alternatively, another conventional restore circuit may comprise two PMOS transistors having their bias electrodes connected respectively to an internal supply voltage sourced and the external supply voltage source.

However, the above-mentioned first conventional restore circuit has a disadvantage in that the drive capability is degraded due to an overshoot of the external supply voltage Vext and the above-mentioned second conventional restore circuit has a disadvantage in that additional manufacturing processes are required to prevent a latch-up phenomenon. The above problems with the conventional restore circuits will hereinafter be described in detail with reference to FIGS. 1 to 4.

Referring to FIG. 1, there is shown a circuit diagram of an example of a conventional restore circuit for a semiconductor memory device. As shown in this drawing, the conventional restore circuit comprises a first PMOS transistor Q1 having its gate for inputting a first control signal from a first input line 11, and a second PMOS transistor Q2 having its gate for inputting a second control signal from a second input line 12. The first PMOS transistor Q1 has its source and bias electrode connected in common to an external supply voltage source and its drain connected to an output line 13, which is connected to a sense amplifier (not shown). When the first control signal from the first input line 11 is low in logic, the first PMOS transistor Q1 is turned on and then remains at its ON state until a restore voltage of a precharge level Vint/2 on the output line 13 is boosted to an internal supply voltage Vint from an internal supply voltage source. As a result, the first PMOS transistor Q1 acts to prevent the restore voltage on the output line 13 from being varied above the internal supply voltage Vint from the internal supply voltage source.

The second PMOS transistor Q2 has its source connected to the internal supply voltage source, its bias electrode connected to the external supply voltage source and its drain connected to the output line 13. When the second control signal from the second input line 12 is low in logic, the second PMOS transistor Q2 is turned on to transfer the internal supply voltage Vint from the internal supply voltage source to the output line 13. As a result, the second PMOS transistor Q2 acts to maintain the restore voltage on the output line 13 at the internal supply voltage level Vint. The second PMOS transistor Q2 remains at its ON state for an interval from the turning-on of the first PMOS transistor Q1 to a low to high transition of the second control signal after the turning-off of the first PMOS transistor Q1.

FIG. 2 is a sectional view illustrating a structure of the conventional restore circuit for the semiconductor memory device in FIG. 1. As shown in this drawing, formed over a semiconductor substrate 20 is an N-type well 21 in which first to fourth P$^-$-type impurity regions 22–25 and an N$^+$ type impurity region 26 are formed. A first gate electrode 27 is formed over a channel region between the first and second P'-type impurity regions 22 and 23. A second gate electrode 28 is formed over a channel region between the third and fourth P$^+$-type impurity regions 24 and 25. The first and second P$^+$-type impurity regions 22 and 23 are source and drain regions, respectively, and constitute the first PMOS transistor Q1 together with the first gate electrode 27. The third and fourth P$^-$-type impurity regions 24 and 25 are drain and source regions, respectively, and constitute the second PMOS transistor Q2 together with the second gate electrode 28. The N$^+$-type impurity region 26 constitutes the common bias electrode of the first and second PMOS transistors Q1 and Q2. The N$^-$-type impurity region 26 is a well pick-up region in which a high-concentration impurity is implanted to enhance a conductivity of the N-type well 21. The N$^+$-type impurity region 26 and the first P$^+$-type impurity region 22 are connected in common to the external supply voltage source. The second and third P$^-$-type impurity regions 23 and 24 are connected in common to the sense amplifier through the output line 13. The fourth p$^+$-type impurity region 25 is connected to the internal supply voltage source. The first and second gate electrodes 27 and 28 are connected to the first and second input lines 11 and 12, respectively.

The above-mentioned conventional restore circuit in FIGS. 1 and 2 is desirable to maintain the restore voltage on the output line 13 constantly at the internal supply voltage level Vint regardless of a variation in an external supply voltage Vext from the external supply voltage source. However, the conventional restore circuit in FIGS. 1 and 2 has a disadvantage in that the second PMOS transistor Q2 is degraded in drive capability due to a voltage increase in the bias electrode with an increase in the external supply voltage Vext. The degradation in the drive capability of the second PMOS transistor Q2 deteriorates a write operation of the sense amplifier for changing a low logic level on the bit line to a high logic level.

Referring to FIG. 3, there is shown a circuit diagram of another example of a conventional restore circuit for a semiconductor memory device. The conventional restore circuit in FIG. 3 has been proposed to overcome the above problem with the conventional restore circuit in FIG. 1.

As shown in FIG. 3, the conventional restore circuit comprises a first PMOS transistor Q3 having its gate for inputting a first control signal from a first input line 31, and a second PMOS transistor Q4 having its gate for inputting a second control signal from a second input line 32. The first PMOS transistor Q3 has its source and bias electrode connected in common to an external supply voltage source and its drain connected to an output line 33, which is connected to a sense amplifier (not shown). When the first control signal from the first input line 31 is low in logic, the first PMOS transistor Q3 is turned on and then remains at its ON state until a restore voltage of a precharge level Vint/2 on the output line 33 is boosted to an internal supply voltage Vint from an internal supply voltage source. As a result, the first PMOS transistor Q3 acts to prevent the restore voltage on the output line 33 from being varied above the internal supply voltage Vint from the internal supply voltage source.

The second PMOS transistor Q4 has its source and bias electrode connected in common to the internal supply voltage source and its drain connected to the output line 33. When the second control signal from the second input line 32 is low in logic, the second PMOS transistor Q4 is turned on to transfer the internal supply voltage Vint from the internal supply voltage source to the output line 33. As a result, the second PMOS transistor Q4 acts to maintain the restore voltage on the output line 33 at the internal supply voltage level Vint. The second PMOS transistor Q4 remains at its ON state for an interval from the turning-on of the first PMOS transistor Q3 to a low to high transition of the second control signal after the turning-off of the first PMOS transistor Q3.

FIG. 4 is a sectional view illustrating a structure of the conventional restore circuit for the semiconductor memory device in FIG. 3. As shown in this drawing, a first N-type well 42 and a P-type well 41 are formed over a semiconductor substrate 40. Formed in the first N-type well 42 are first and second $P^+$-type impurity regions 44 and 45 and a first $N^+$-type impurity region 46. A first gate electrode 51 is formed over a channel region between the first and second $P^+$-type impurity regions 44 and 45. The first and second $P^+$-type impurity regions 44 and 45 are source and drain regions, respectively, and constitutes the first PMOS transistor Q3 together with the first gate electrode 51.

A second N-type well 43 and a third P'-type impurity region 47 are formed in the P-type well 41. Formed in the second N-type well 43 are fourth and fifth $P^+$-type impurity regions 48 and 49 and a second $N^-$-type impurity region 50. A second gate electrode 52 is formed over a channel region between the fourth and fifth P'-type impurity regions 48 and 49. The fourth and firth $P^+$-type impurity regions 48 and 49 are drain and source regions, respectively, and constitute the second PMOS transistor Q4 together with the second gate electrode 52.

The first and second $N^+$-type impurity regions 46 and 50 constitute the bias electrodes of the first and second PMOS transistors Q3 and Q4, respectively. The first $N^+$-type impurity region 46 is a well pick-up region in which a high-concentration impurity is implanted to enhance a conductivity of the first N-type well 42. Similarly, the second $N^+$-type impurity region 50 is a well pick-up region in which a high-concentration impurity is implanted to enhance a conductivity of the second N-type well 43. The first N'-type impurity region 46 and the first P'-type impurity region 44 are connected in common to the external supply voltage source. The second and fourth P'-type impurity regions 45 and 48 are connected in common to the sense amplifier through the output line 33. The fifth P'-type impurity region 49 and the second $N^+$-type impurity region 50 are connected in common to the internal supply voltage source. The first and second gate electrodes 51 and 52 are connected to the first and second input lines 31 and 32, respectively. The third $P^-$-type impurity region 47 is a well pick-up region for enhance a conductivity of the P-type well 41. The third $P^+$-type impurity region 47 is connected to a ground voltage source Vss to prevent a latch-up phenomenon of the second PMOS transistor Q4.

However, the above-mentioned conventional restore circuit in FIG. 3 has a disadvantage in that a latch-up phenomenon occurs when an external supply voltage Vext from the external supply voltage source is instantaneously raised while it is transferred to the output line 33 through the first PMOS transistor Q3. The latch-up phenomenon signifies that the restore voltage on the output line 33 is transferred to the internal supply voltage source. At this time, the restore voltage on the output line 33 exceeds a level of the internal supply voltage Vint+a voltage for turning on a PN junction between the drain and the bias electrode. In order to prevent such a latch-up phenomenon, the P-type well 41 is provided in addition to the construction of FIG. 3, as shown in FIG. 4. However, additional manufacturing processes are required to provide the P-type well 41 for preventing the latch-up phenomenon.

SUMMARY OF THE INVENTION

Therefore, the present invention has been made in view of the above problems, and it is an object of the present invention to provide a restore circuit for a semiconductor memory device which is capable of generating a restore voltage which is stable with respect to a variation in an external supply voltage, with no increase in the number of manufacturing processes and no degradation in the drive capability.

In accordance with an aspect of the present invention, there is provided a restore circuit for a semiconductor memory device with a sense amplifier and an internal supply voltage source, comprising a first PMOS transistor having its gate for inputting a first control signal from a first input line, its source and bias electrode connected in common to an external supply voltage source and its drain connected to an output line, the output line being connected to the sense amplifier; a second PMOS transistor having its gate for inputting a second control signal from a second input line, its source connected to the internal supply voltage source and its drain connected to the output line; and feedback means for feeding a voltage on the output line back to a bias electrode of the second PMOS transistor.

In accordance with another aspect of the present invention there is provided a restore circuit structure for a semiconductor memory device, comprising first and second N-type wells formed over a semiconductor substrate; first and second $P^+$-type impurity regions formed in the first N-type well; a first gate electrode formed over a channel region between the first and second $P^+$-type impurity regions; third to fifth impurity regions formed in the second N-type well; a second gate electrode formed over a channel region between the third and fourth P'-type impurity regions; a third gate electrode formed over a channel region between the fourth and fifth P$^-$-type impurity regions; a first wiring for connecting the first P'-type impurity region and the first N-type well to an external supply voltage source; a second wiring for connecting the second and third $P^+$-type impurity regions and the third gate electrode to a sense amplifier; a third wiring for connecting the fourth $P^+$-type impurity region to an internal supply voltage source; a fourth wiring for connecting the fifth $P^+$-type impurity region to the second N-type well; a fifth wiring for transferring a first control signal to the first gate electrode; and a sixth wiring for transferring a second control signal to the second gate electrode.

The restore circuit structure for the semiconductor memory device further comprises a sixth P'-type impurity region formed in the second N-type well adjacent to the fifth $P^+$-type impurity region, the sixth $P^+$-type impurity region being connected to the sense amplifier by the second wiring;

and a fourth gate electrode formed over a channel region between the fifth and sixth P$^+$-type impurity regions, the fourth gate electrode being connected to the internal supply voltage source by the third wiring.

BRIEF DESCRIPTION OF THE DRAWINGS

The above and other objects, features and advantages of the present invention will be more clearly understood from the following detailed description taken in conjunction with the accompanying drawings, in which.

DETAILED DESCRIPTION OF THE PREFERRED EMBODIMENTS

Figure 1:
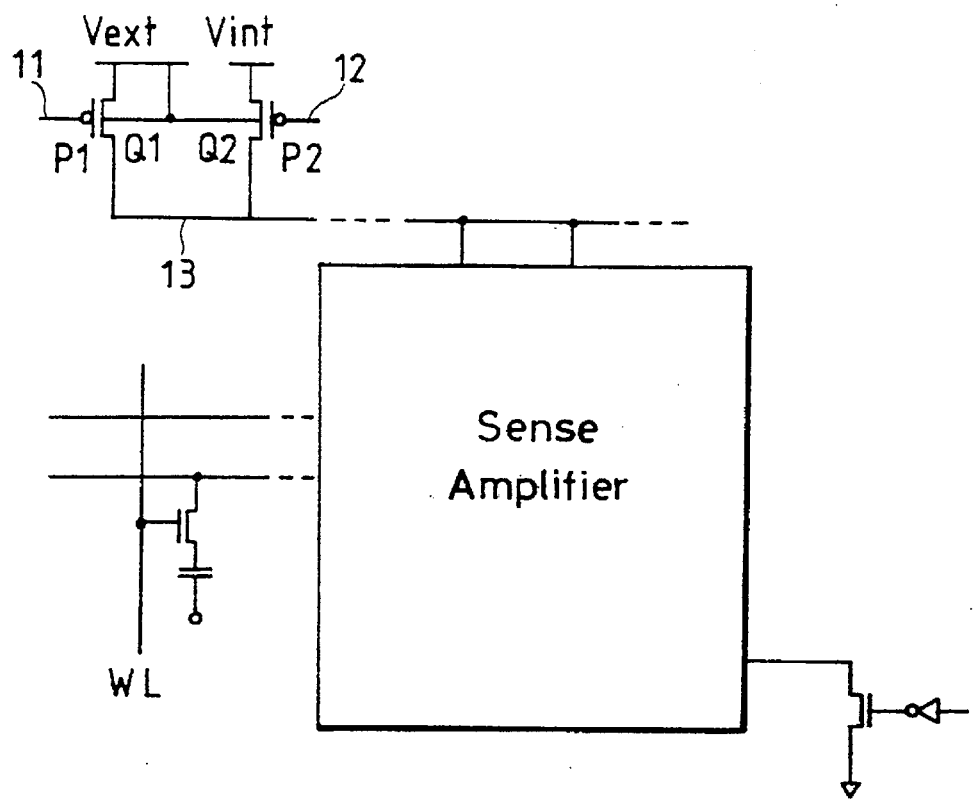
FIG. 1 is a circuit diagram illustrating an example of a conventional restore circuit for a semiconductor memory device.
Figure 2:
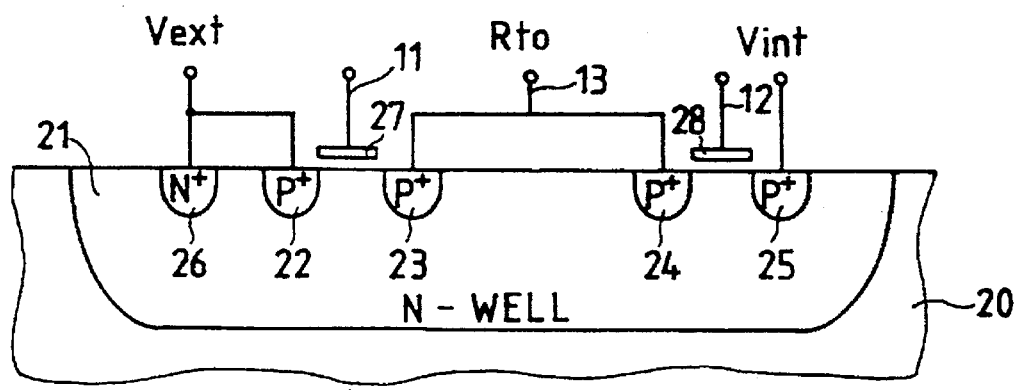
FIG. 2 is a sectional view illustrating a structure of the conventional restore circuit for the semiconductor memory device in FIG. 1.
Figure 3:
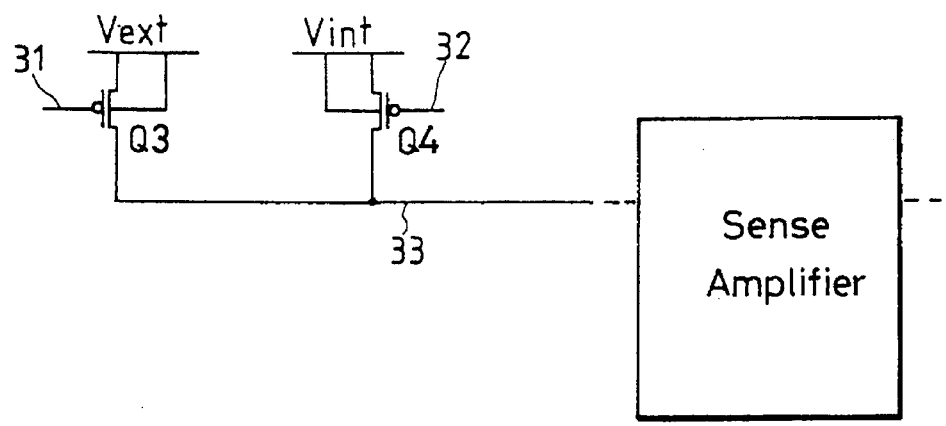
FIG. 3 is a circuit diagram illustrating another example of a conventional restore circuit for a semiconductor memory device.
Figure 4:
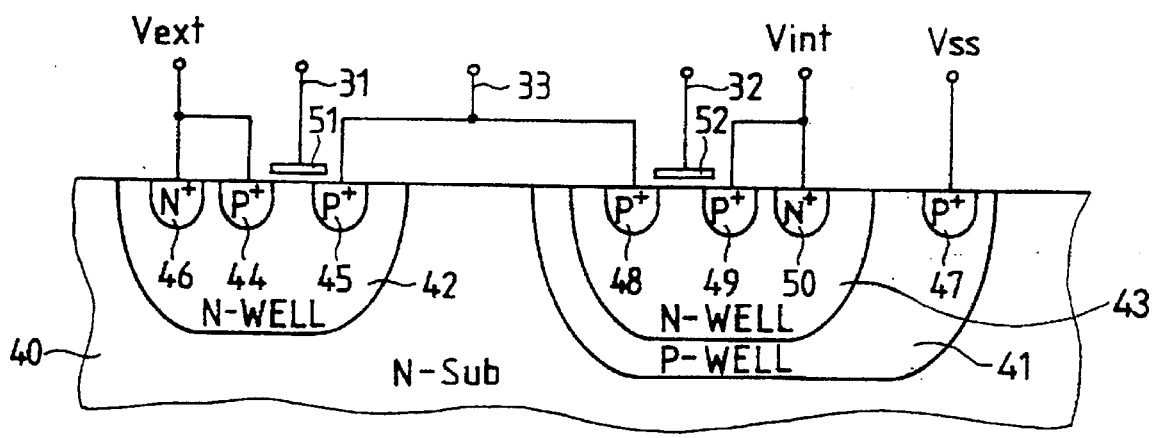
FIG. 4 is a sectional view illustrating a structure of the conventional restore circuit for the semiconductor memory device in FIG. 3.
Figure 5:
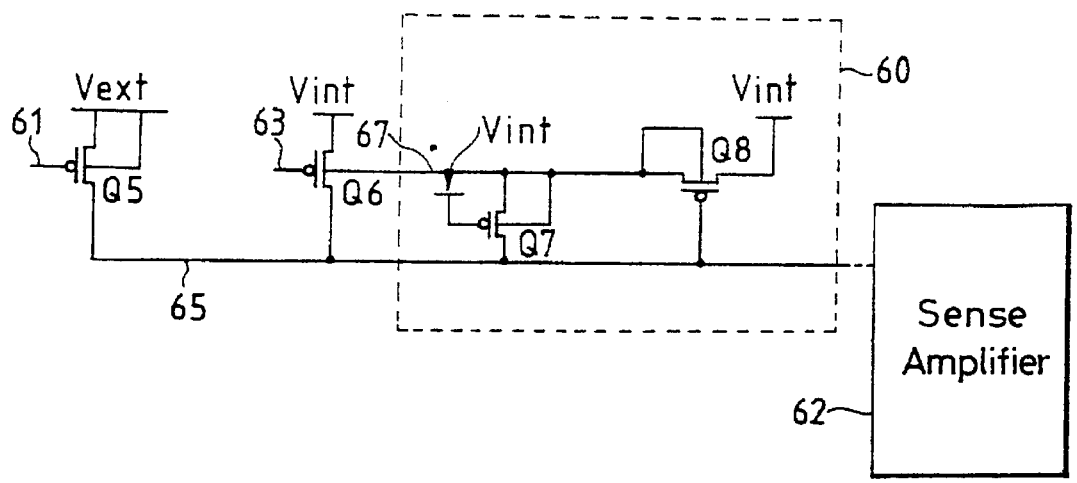
FIG. 5 is a circuit diagram illustrating a restore circuit for a semiconductor memory device in accordance with an embodiment of the present invention.

Referring to FIG. 5, there is shown a circuit diagram of a restore circuit for a semiconductor memory device in accordance with an embodiment of the present invention. As shown in this drawing, the restore circuit comprises a first PMOS transistor Q5 having its gate for inputting a first control signal from a first input line 61, and a second PMOS transistor Q6 having its gate for inputting a second control signal from a second input line 63. The first PMOS transistor Q5 has its source and bias electrode connected in common to an external supply voltage source and its drain connected to an output line 65, which is connected to a sense amplifier 62. When the first control signal from the first input line 61 is low in logic, the first PMOS transistor Q5 is turned on and then remains at its ON state until a restore voltage of a precharge level Vint/2 on the output line 65 is boosted to an internal supply voltage Vint from an internal supply voltage source. As a result, the first PMOS transistor Q5 acts to prevent the restore voltage on the output line 65 from being varied above the internal supply voltage Vint from the internal supply voltage source.

The second PMOS transistor Q6 has its source connected to the internal supply voltage and its drain connected to the output line 65. When the second control signal from the second input line 63 is low in logic, the second PMOS transistor Q6 is turned on to transfer the internal supply voltage Vint from the internal supply voltage source to the output line 65. As a result, the second PMOS transistor Q6 acts to maintain the restore voltage on the output line 65 at the internal supply voltage level Vint. The second PMOS transistor Q6 remains at its ON state for an interval from the turning-on of the first PMOS transistor Q5 to a low to high transition of the second control signal after the turning-off of the first PMOS transistor Q5.

The restore circuit further comprises a feedback loop 60 connected among a bias electrode of the second PMOS transistor Q6, the internal supply voltage source and the output line 65. In a standby mode in which the first and second control signals from the first and second input lines 61 and 63 are both high in logic, namely, when the restore voltage on the output line 65 is maintained at the precharge level Vint/2, the feedback loop 60 transfers the internal supply voltage Vint from the internal supply voltage source to the bias electrode of the second PMOS transistor Q6 through a source and a drain of a fourth PMOS transistor Q8 and a node 67. In the case where an external supply voltage Vext from the external supply voltage source is increased while the first and second PMOS transistors Q5 and Q6 are operated, the feedback loop 60 feeds the restore voltage on the output line 65 back to the bias electrode of the second PMOS transistor Q6 through a source and a drain of a third PMOS transistor Q7 and the node 67. As a result, the restore voltage on the output line 65 is prevented from being latched up to the internal supply voltage source although the external supply voltage Vext is increased. The reason is that no voltage difference is produced between the drain and bias electrode of the second PMOS transistor Q6 although the restore voltage on the output line 65 is increased as the external supply voltage Vext is increased. The production of no voltage difference between the drain and bias electrode of the second PMOS transistor Q6 results in no degradation in drive capability of the second PMOS transistor Q6 and sense amplifier 62. The third PMOS transistor Q7 has its source for inputting the restore voltage on the output line 65 and its gate for inputting the internal supply voltage Vint from the internal supply voltage source. When the restore voltage on the output line 65 is higher than the internal supply voltage Vint from the internal supply voltage source, the third PMOS transistor Q7 is turned on. As the third PMOS transistor Q7 is turned on, it transfers the restore voltage on the output line 65 to the bias electrode of the second PMOS transistor Q6 through its drain and the node 67. The fourth PMOS transistor Q8 has its gate for inputting the restore voltage on the output line 65 and its source for inputting the internal supply voltage Vint from the internal supply voltage source. When the restore voltage on the output line 65 is lower than the internal supply voltage Vint from the internal supply voltage source, the fourth PMOS transistor Q8 is turned on. As the fourth PMOS transistor Q8 is turned on, it transfers the internal supply voltage Vint from the internal supply voltage source to the bias electrode of the second PMOS transistor Q6 through its drain and the node 67.

Figure 6:
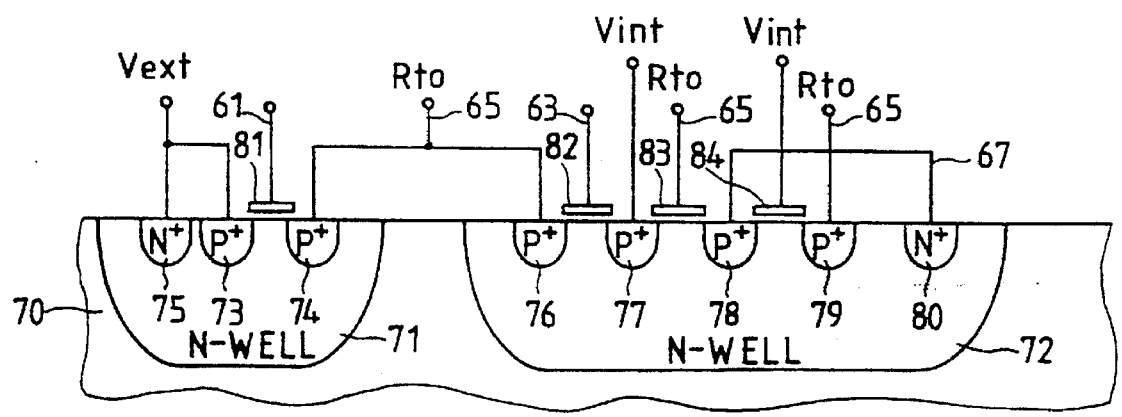
FIG. 6 is a sectional view illustrating a structure of the restore circuit for the semiconductor memory device in FIG. 5 in accordance with the embodiment of the present invention.

FIG. 6 is a sectional view illustrating a structure of the restore circuit for the semiconductor memory device in FIG. 5 in accordance with the embodiment of the present invention. As shown in this drawing, first and second N-type wells 71 and 72 are formed over a semiconductor substrate 70. Formed in the first N-type well 71 are first and second P$^+$-type impurity regions 73 and 74 and a first N$^+$-type impurity region 75. A first gate electrode 81 is formed over a channel region between the first and second P$^+$-type impurity regions 73 and 74. The first and second P$^+$-type impurity regions 73 and 74 are source and drain regions, respectively, and constitute the first PMOS transistor Q5 together with the first gate electrode 81.

Formed in the second N-type well 72 are third to sixth P$^+$-type impurity regions 76–79 and a second N$^-$-type impurity region 80. A second gate electrode 82 is formed over a channel region between the third and fourth P$^-$-type impurity regions 76 and 77. A third gate electrode 83 is formed over a channel region between the fourth and fifth P$^-$-type impurity regions 77 and 78. A fourth gate electrode 84 is formed over a channel region between the fifth and sixth P'-type impurity regions 78 and 79. The third and fourth P$^+$-type impurity regions 76 and 77 are drain and source regions, respectively, and constitute the second PMOS transistor Q6 together with the second gate electrode 82. The fourth and fifth P$^-$-type impurity regions 77 and 78 are source and drain regions, respectively, and constitute the fourth PMOS transistor Q8 together with the third gate electrode 83. The fifth and sixth P$^+$-type impurity regions 78 and 79 are drain and source regions, respectively, and constitute the third PMOS transistor Q7 together with the fourth gate electrode 84. The first N$^-$-type impurity region 75 constitutes the bias electrode of the first PMOS transistor Q5. The second N$^+$-type impurity region 80 constitutes the common bias electrode of the second to fourth PMOS transistors Q6–Q8. The first N'-type impurity region 75 is a well pick-up region in which a high-concentration impurity is implanted to enhance a conductivity of the first N-type well 71. Similarly, the second N$^-$-type impurity region 80 is a well pick-up region in which a high-concentration impurity is implanted to enhance a conductivity of the second N-type well 72.

The first P'-type impurity region 73 and the first N$^+$-type impurity region 75 are connected in common to the external supply voltage source. The second, third and sixth P'-type impurity regions 74, 76 and 79 and the third gate electrode 83 are connected in common to the sense amplifier 62 through the output line 65. The fourth P'-type impurity region 77 and the fourth gate electrode 84 are connected in common to the internal supply voltage source. The fifth P'-type impurity region 78 is connected to the second N$^+$-type impurity region 80 through the node 67. The first and second gate electrodes 81 and 82 are connected to the first and second input lines 61 and 63, respectively.

The first and second N-type well 71 and 72 are formed by one process. Also, the first to sixth P$^+$-type impurity regions 73, 74, 76, 77, 78 and 79 are formed by one process. Similarly, the first and second N$^+$-type impurity regions 75 and 80 and the first to fourth gate electrodes are formed by one process.

As apparent from the above description, according to the present invention, the feedback loop is provided to feed the restore voltage on the output line back to the bias electrode of the second PMOS transistor in the case where the external supply voltage is increased. Therefore, the provision of the feedback loop has the effect of preventing the restore voltage on the output line from being latched up and the drive capability from being degraded. Further, the MOS transistors are formed in the same N-type well. This has the effect of preventing manufacturing processes from being increased in number.

Although the preferred embodiments of the present invention have been disclosed for illustrative purposes, those skilled in the art will appreciate that various modifications, additions and substitutions are possible, without departing from the scope and spirit of the invention as disclosed in the accompanying claims.

What is claimed is:

1. A restore circuit for a semiconductor memory device with a sense amplifier and an internal supply voltage source, comprising:

a first PMOS transistor having a gate for inputting a first control signal from a first input line, a source and a bias electrode connected in common to an external supply voltage source and a drain connected to an output line, said output line being connected to said sense amplifier, a second PMOS transistor having a gate for inputting a second control signal from a second input line, a source connected to said internal supply voltage source and a drain connected to said output line; and feedback means for feeding a voltage on said output line back to a bias electrode of said second PMOS transistor.

2. A restore circuit for a semiconductor memory device as set forth in claim 1, wherein said feedback means includes a third PMOS transistor having a gate connected to said internal supply voltage source, a source connected to said output line and a drain and a bias electrode connected in common to said bias electrode of said second PMOS transistor.

3. A restore circuit for a semiconductor memory device as set forth in claim 2, wherein said feedback means further includes a fourth PMOS transistor having a gate connected to said output line, a source connected to said internal supply voltage source and a drain and a bias electrode connected in common to said bias electrode of said second PMOS transistor.

\* \* \* \* \*